United States Patent [19]
Claxton

[11] 3,906,385
[45] Sept. 16, 1975

[54] GUNN EFFECT POWER DIVIDER

[75] Inventor: Dale H. Claxton, Hawthorne, Calif.
[73] Assignee: TRW Inc., Redondo Beach, Calif.

[22] Filed: Dec. 20, 1974
[21] Appl. No.: 534,603

[52] U.S. Cl. .............. 330/5; 307/299 R; 331/107 R
[51] Int. Cl.[2] .............................................. H03F 3/04
[58] Field of Search ..... 307/299; 330/5; 331/107 G, 331/60, 173; 357/3

[56] References Cited

UNITED STATES PATENTS 3,691,481 9/1972 Kataoka et al. ...................... 330/5 X

*Primary Examiner*—R. V. Rolinec
*Assistant Examiner*—Darwin R. Hostetter
*Attorney, Agent, or Firm*—Daniel T. Anderson, Esq.; Edwin A. Oser, Esq.; Jerry A. Dinardo

[57] ABSTRACT

A Gunn effect triode is utilized to provide a power divider. The power divider may, for example, be provided with a main branch from which depend two or more legs and from each of which a replica of the input signal is obtained. Since a Gunn effect triode is an amplifier, the output signal is amplified whereas the conventional divider experiences a substantial loss. The power divider is characterized by its extremely small area which may be on the order of 25 microns squared and by its increased sensitivity.

4 Claims, 3 Drawing Figures

GUNN EFFECT POWER DIVIDER

BACKGROUND OF THE INVENTION

This invention relates generally to Gunn effect devices or triodes and particularly relates to a power divider.

The Gunn effect has been discovered in 1963 by J. B. Gunn who discovered that coherent microwave oscillations may be generated in bulk gallium arsenide semiconductor material. The physics of such Gunn effect devices has been explained in a book by S. M. Sze, "Physics of Semiconductor Devices" published by John Wiley and Sons 1969 (see particularly pages 731–784).

Specifically, a Gunn triode will amplify an input signal and operates in the microwave region. The device itself is extremely small, that is on the order of 10–20 microns long. Even though the effect is a bulk effect, the thickness of the effective layer may be on the order of one-tenth of its length, that is 1–2 microns thick. Such devices are characterized not only by their small size, but by appreciable isolation between input and output terminals.

A conventional power divider may be realized by coupling between adjacent transmission lines or by coupling between intersecting transmission lines as in a hybrid network. However, all conventional power dividers experience loss. Furthermore, conventional power dividers require one or more quarter wavelength sections of a transmission line; therefore, they tend to be rather large.

It is accordingly an object of the present invention to provide a Gunn effect power divider which is characterized by its extremely small size.

Another object of the invention is to provide a power divider of the type referred to which exhibits gain rather than a loss.

A further object of the present invention is to provide a Gunn effect power divider which is characterized by increased sensitivity, assuming that the noise is not too large.

SUMMARY OF THE INVENTION

A Gunn effect power divider in accordance with the present invention comprises a substrate of semi-insulating material. This may, for example, consist of gallium arsenide having a resistivity on the order of $10^9$ ohms per centimeter. The gallium arsenide is relatively pure and hence has a high resistance. The Gunn effect is also exhibited by other materials including germanium and certain compound semiconductors such as InP indium phosphide.

A semiconductive material is disposed on the substrate. This semiconductive material must exhibit the Gunn effect and hence has a differential negative resistance and is capable of domain nucleation under proper bias conditions. This semiconductive material may consist of n-type gallium arsenide having an impurity concentration on the order of $10^{15}$ to $10^{17}$ atoms per cubic centimeter.

The semiconductive material has a shape to provide a main branch and a plurality of side branches or legs substantially parallel to each other. The side branches are connected to the main branch and disposed substantially at a right angle to the main axis of the main branch.

The main branch is provided with an ohmic electrode forming a cathode, while each side branch is provided at its far end with an ohmic contact forming an anode.

The ohmic electrodes are of the conventional type and may consist of a metal coating such as tin or gold-germanium.

A Schottky barrier electrode is disposed near the cathode of the main branch and is contiguous to the side branches. It preferably extends across the entire length of the main branch.

Means are provided for applying a bias voltage between the cathode and the respective anodes to create an electric field which is below the threshold field where domain nucleation begins.

An input signal is applied between the cathode and the Schottky electrode. The output signals are derived between each anode and the common cathode. Due to the amplifying effect of the Gunn effect device the respective output signals are amplified.

The novel features that are considered characteristic of this invention are set forth with particularly in the appended claims. The invention itself, however, both as to its organization and method of operation, as well as additional objects and advantages thereof, will best be understood from the following description when read in connection with the accompanying drawing.

DESCRIPTION OF THE PREFERRED EMBODIMENT

Figure 1:
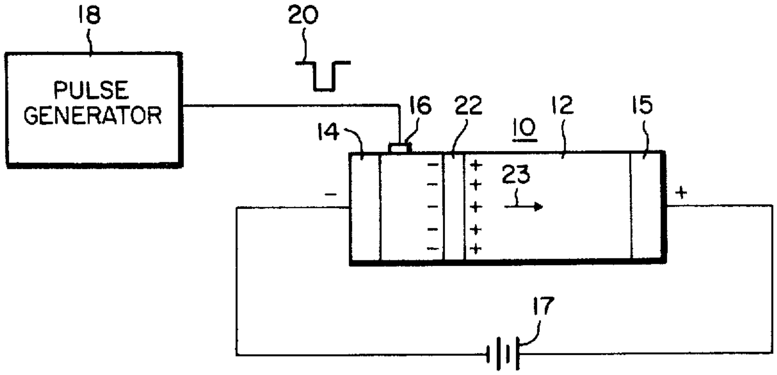
FIG. 1 is a schematic representation of a conventional Gunn triode for the purpose of explaining the Gunn effect and the operation of the triode.
Figure 2:
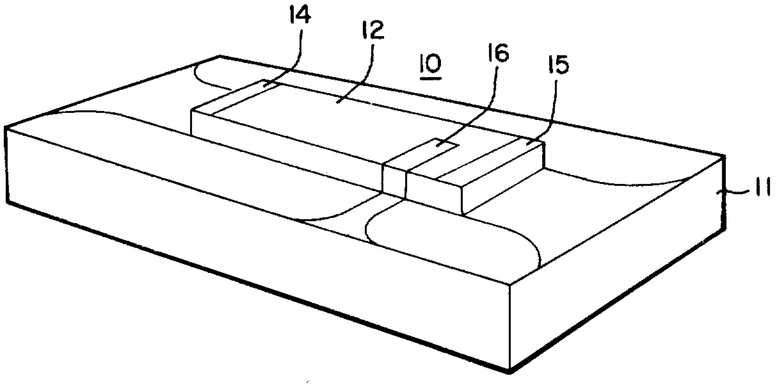
FIG. 2 is a view in perspective of a Gunn triode device to illustrate the substrate, the triode and its electrodes.

Referring now to FIG. 1, there is illustrated a conventional Gunn effect triode 10 which has been illustrated for the purpose of explaining the operation of such a device. Reference is also made to FIG. 2 which illustrates a physical embodiment of a Gunn effect triode. The triode has a substrate 11 of semi-insulating material as has previously been described. Disposed on the substrate 11 is a layer 12 of semiconductive material exhibiting the Gunn effect. As previously explained, the substrate 11 may consist of relatively pure gallium arsenide while the semiconductive material 12 may also consist of n-type gallium arsenide. Thus the substrate may have a resistivity of $10^9$ ohms per centimeter and the semiconductive layer 12 may have an impurity concentration of $10^{15}$ to $10^{17}$ atoms or charge carriers per cubic centimeter. The layer 12 may, for example, be grown epitaxially. Thus, for example, the layer may be grown from the vapor or gas phase or alternatively from the liquid phase, both systems being well known and conventional.

The device is further provided with a cathode 14 and an anode 15, each consisting of an ohmic contact. This may, for example, be realized by a tin, or gold-germanium layer on the semiconductive material 12.

There is further provided a Schottky barrier electrode 16 which is a rectifying electrode and disposed adjacent the cathode 14. It may, for example, be realized by a gold contact on the gallium arsenide.

The bias voltage may be applied by a battery 17, connected between the cathode 14 and the anode 15. This will create an electric field which is below the threshold field necessary to create domain nucleation. The threshold field is on the order of 3.5 kilovolts per centimeter. This may be created by a corresponding threshold voltage. Finally, a pulse generator 18 may be connected to the Schottky barrier electrode 16 to apply negative going trigger pulses 20 thereto. These trigger pulses 20 will now increase the electric field beyond the threshold field to create a dipole domain indicated at 22.

Gallium arsenide exhibits two potential wells or valleys in the conduction band of the material. Normally, the electrons are in the lower valley. However, if their energy is increased by an applied electric field, they will transfer or scatter to the upper valley. This in turn will increase their energy but decrease their mobility and hence their drift velocity. Thus, the combined effect of the bias created by battery 17 and the applied trigger pulse 20 will exceed the threshold field and initiate nucleation. The electrons in the region 22 will now slow down causing an excess of electrons behind the region 22 and a deficiency of electrons ahead of the region 22 thus forming the dipole 22 which is now swept as shown by the arrow 23 toward the cathode 15.

The frequency of operation is determined by the drift velocity and the physical length of the device. The domain velocity is about $10^7$ centimeters per second and the device length on the order of 10 microns. For example, if the device is designed to operate at 10 gigahertz the transit time may be 100 picoseconds for a device having a length of 10 microns.

It will be evident that while one dipole domain 22 moves toward the cathode 15, no other dipole nucleation can take place. This effect in turn determines the highest possible frequency of operation of the device. However, as indicated above the physics and operation of a Gunn effect triode are well known as shown by the book above referred to.

Figure 3:
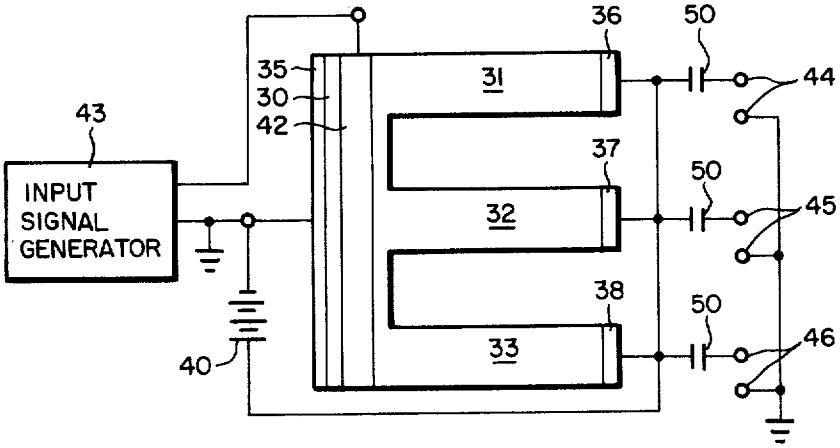
FIG. 3 is a schematic representation of a power divider in accordance with the present invention provided with three output terminals.

A Gunn effect power divider in accordance with the present invention is illustrated in FIG. 3 to which reference is now made. The device has a substrate such as the substrate 11 of FIG. 2. The semiconductive material provided over the substrate has the shape of a main branch 30 and three side branches 31, 32 and 33. The three side branches 31–33 are directly connected to the main branch; they are parallel to each other and extend substantially at right angles with respect to the main axis of the main branch 30. Thus as shown the entire device may have roughly the shape of a square and its dimensions may, for example, be 25 microns squared.

The main branch 30 is provided with an ohmic electrode 35 forming a cathode. Each of the side branches 31–33 is provided at its far end with an ohmic electrode 36, 37 and 38, each forming an anode. A bias voltage is applied between the cathode 35 and each anode 36–38 by a battery 40. The bias voltage should be below the threshold voltage so that the device is not capable of nucleation.

A Schottky barrier electrode 42 is disposed adjacent to and substantially parallel to the cathode 35 and extends parallel to the main axis of the main branch 30. The electrodes 35–38 and 42 may consist of the materials previously described and the entire device may be made in a manner above disclosed.

An input signal obtained from an input signal generator 43 is applied between the cathode 35 and the Schottky electrode 42. The cathode 35 may be grounded as shown. The output signals may be obtained from output terminals 44, 45 and 46. Each of the output terminals is connected to its respective anode 36–38 by a blocking capacitor 50 while the other output terminal is grounded, that is connected to the cathode 35.

The operation of the Gunn effect power divider is based on the transverse spreading effect which has first been described in the literature 1971. In other words, even though a domain nucleates at a single point it spreads about the equipotential lines at about ten times the electron drift velocity. This is due to the fact that propagation in the transverse direction is by electric field while particles cause propagation in the axial direction.

The input signal preferably is a sinusoidal signal or an RF signal. Accordingly, domain formation is initiated on each negative half cycle, assuming that the electric bias field together with the negative voltage of the input signal exceed the threshold voltage or field. The threshold voltage is on the order of 3.5 kilovolt per centimeter. In other words, the voltage of the input signal must be sufficiently high to initiate nucleation.

The other condition is that the frequency of the input signal must be equal to or less than the reciprocal of the domain transit time which is given by the device length divided by the saturated electron drift velocity. This drift velocity is $10^7$ centimeter per second. This is due to the fact that only one dipole domain can exist at any one time in the Gunn effect triode.

Every time a domain is initiated it will travel toward the three anodes 36–38 due to the transverse spreading effect. The amplitude of the domain grows expotentially in time and space and therefore the triode exhibits its gain. It also has isolation in the forward direction of between 20–30 db.

In addition, the power divider of the invention has about 10 db more power at each pair of output 44, 45 and 46 than at its input. On the other hand, a conventional four-way power divider exhibits about 12 db loss at each output port compared to the input port. Therefore, as long as the noise in each leg is less than the 22 db difference in power, an improvement in sensitivity is realized.

It will be realized that the power divider of the invention may have any number of legs such as two or more up to the limitations of the material which might degrade the performance.

There has thus been disclosed a Gunn effect power divider which is characterized by its extremely small size. It is particularly useful in the microwave region. In contradistinction to the conventional power dividers it exhibits gain between input and output ports. Therefore, the resulting device will have improved sensitivity.

What is claimed is:

1. A Gunn effect power divider comprising:

a. a substrate of semi-insulating material;

b. a semiconductive material disposed on said substrate, said semiconducting material exhibiting the Gunn effect and having differential negative resistance and capable of domain nucleation;

c. said semiconductive material having a main branch and a plurality of side branches connected thereto and disposed substantially parallel to each other and at right angles to the axis of said main branch;
d. said main branch having an ohmic electrode forming a cathode;
e. each of said side branches having an ohmic electrode at its far end forming an anode;
f. means for biasing said ohmic electrodes to create an electric field in said semiconductive material below the threshold field where domain nucleation begins;
g. a Schottky barrier electrode disposed near the cathode of said main branch and adjacent said side branches;
h. means for applying an input signal between said cathode and said Schottky electrode, said input signal having a peak amplitude sufficient together with said electric field to initiate domain nucleation, whereby a dipole domain is caused to travel through said side branches; and
i. means for deriving an output signal between each of the anodes of said side branches and said cathode, whereby amplification of said signal takes place.

2. A power divider as defined in claim 1 wherein said substrate consists of gallium arsenide and wherein said semiconductive material consists of n-type, doped gallium arsenide.

3. A power divider as defined in claim 2 wherein said input signal is a sinusoidal signal.

4. A power divider as defined in claim 2 wherein said Schottky electrode extends across the entire length of said main branch.

* * * * *